(12) United States Patent
Ferret et al.

(10) Patent No.: US 11,049,997 B2
(45) Date of Patent: Jun. 29, 2021

(54) OPTOELECTRONIC DEVICE COMPRISING THREE-DIMENSIONAL SEMICONDUCTOR STRUCTURES WITH A WIDER SINGLE-CRYSTAL PORTION

(71) Applicant: COMMISSARIAT A L'ENERGIE ATOMIQUE ET AUX ENERGIES ALTERNATIVES, Paris (FR)

(72) Inventors: Pierre Ferret, Grenoble (FR); Abdelkarim Kahouli, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 487 days.

(21) Appl. No.: 15/779,727

(22) PCT Filed: Nov. 28, 2016

(86) PCT No.: PCT/FR2016/053121
§ 371 (c)(1),
(2) Date: Jul. 18, 2018

(87) PCT Pub. No.: WO2017/093645
PCT Pub. Date: Jun. 8, 2017

(65) Prior Publication Data
US 2020/0313042 A1 Oct. 1, 2020

(30) Foreign Application Priority Data
Nov. 30, 2015 (FR) ........................................ 1561587

(51) Int. Cl.
*H01L 33/24* (2010.01)
*H01L 31/0304* (2006.01)
(Continued)

(52) U.S. Cl.
CPC ........ *H01L 33/24* (2013.01); *H01L 31/03048* (2013.01); *H01L 31/035236* (2013.01);
(Continued)

(58) Field of Classification Search
CPC ............... H01L 33/24; H01L 31/03048; H01L 31/035236; H01L 31/035281;
(Continued)

(56) References Cited

U.S. PATENT DOCUMENTS 7,521,274 B2 * 4/2009 Hersee .............. H01L 21/02609
438/41
8,785,905 B1 7/2014 Wang et al.
(Continued)

FOREIGN PATENT DOCUMENTS

| FR | 3 000 611 A1 | 7/2014 |
| WO | WO 2012/136665 A1 | 10/2012 |
| WO | WO 2017/009583 A1 | 1/2017 |

OTHER PUBLICATIONS

Tien Khee NG, et al., "The Formation of Hexagonal-shaped InGaN-nanodisk on GaN-Nanowire Observed in Plasma Source Molecular Beam Epitaxy," Gallium Nitride Materials and Devices IX, Proc. of SPIE, vol. 8986, Mar. 8, 2014, pp. 898613-1-898613-6.
(Continued)

*Primary Examiner* — Vu A Vu
(74) *Attorney, Agent, or Firm* — Oblon, McClelland, Maier & Neustadt, L.L.P.

(57) ABSTRACT

The invention relates to an optoelectronic device, having at least one microwire or nanowire extending along a longitudinal axis substantially orthogonal to a plane of a substrate, and including: a first doped portion produced from a first semiconductor compound; an active zone extending from the first doped portion; a second doped portion, at least partially covering the active zone; characterised in that the
(Continued)

active zone comprises a wider single-crystal portion: formed of a single crystal of a second semiconductor compound and at least one additional element; extending from an upper face of one end of the first doped portion, and having a mean diameter greater than that of the first doped portion.

17 Claims, 4 Drawing Sheets

(51) Int. Cl.
  H01L 31/0352 (2006.01)
  H01L 31/18 (2006.01)
  H01L 33/00 (2010.01)
  H01L 33/06 (2010.01)
  H01L 33/32 (2010.01)
(52) U.S. Cl.
  CPC .. H01L 31/035281 (2013.01); H01L 31/1848 (2013.01); H01L 31/1852 (2013.01); H01L 33/007 (2013.01); H01L 33/06 (2013.01); H01L 33/32 (2013.01); H01L 33/0025 (2013.01)
(58) Field of Classification Search
  CPC ............. H01L 31/1848; H01L 31/1852; H01L 33/007; H01L 33/06; H01L 33/32; H01L 33/0025; H01L 31/035227; H01L 31/03044
  USPC .......................................................... 257/13
  See application file for complete search history.

(56) References Cited

U.S. PATENT DOCUMENTS

| | | | | |
|---|---|---|---|---|
| 8,895,337 | B1 * | 11/2014 | Wang | ...................... H01L 33/04 438/47 |
| 2012/0217474 | A1 | 8/2012 | Zang et al. | |
| 2014/0077220 | A1 | 3/2014 | Kryliouk et al. | |
| 2015/0207033 | A1 | 7/2015 | Kryliouk et al. | |

OTHER PUBLICATIONS

Shamsul Arafin, et al., "Review of recent progress of III-nitride nanowire lasers," Journal of Nanophotonics, vol. 7, No. 1, Sep. 20, 2013, 28 pages.
Joachim Piprek, "Efficiency droop in nitride-based light-emitting diodes," Phys. Status Solidi A, vol. 207, No. 10, Jul. 15, 2010, pp. 2217-2225.
K. Pantzas, et al., "Semibulk InGaN: A novel approach for thick, single phase, epitaxial InGaN layers grown by MOVPE," Journal of Crystal Growth, No. 370, 2013, pp. 57-62.
G. B. Stringfellow, "Microstructures produced during the epitaxial growth of InGaN alloys," Journal of Crystal Growth, No. 312, 2010, pp. 735-749.
K. P. O'Donnell, et al., "It's not easy being green: Strategies for all-nitrides all-colour solid state lighting," Phys. Status Solidi RRL, vol. 6, No. 2, 2012, pp. 49-52.
Hwa-Mok Kim, et al., "High-Brightness Light Emitting Diodes Using Dislocation-Free Indium Gallium Nitride/Gallium Nitride Multiquantum-Well Nanorod Arrays," Nano Letters, vol. 4, No. 5, 2004, pp. 1059-1062.
Yuji Zhao, et al., "Indium incorporation and emission properties of nonpolar and semipolar InGaN quantum wells," Applied Physics Letters 100, 201108, 2012, 5 pages.
R. Koester, et al., "Self-assembled growth of catalyst-free GaN wires by metal-organic vapour phase epitaxy," Nanotechnology 21 015602, 2010, 10 pages.
Robert Koester, et al., "M-Plane Core-Shell InGaN/GaN Multiple-Quantum-Wells on GaN Wires for Electroluminescent Devices," Nano Letters, dx.doi.org/10.1021/nl202686n, Aug. 3, 2011, pp. A-G.
Katsumi Kishino, et al., "Near-Infrared InGaN Nanocolumn Light-Emitting Diodes Operated at 1.46 μm," Applied Physics Express, No. 5, 2012, pp. 031001-1-031001-3.
International Search Report dated Mar. 10, 2017 in PCT/FR2016/053121 filed Nov. 28, 2016.
Office Action dated Sep. 28, 2020 in corresponding European Patent Application No. 16 813 091.2, 10 pages.
A. Syrkin et al., "First all-HVPE grown InGaN/InGaN MQW LED structures for 460-510 nm", phys. stat. sol. (c) 5, No. 6, 2244-2246 (2008) / DOI 10.1002/pssc.200778647.

* cited by examiner

OPTOELECTRONIC DEVICE COMPRISING THREE-DIMENSIONAL SEMICONDUCTOR STRUCTURES WITH A WIDER SINGLE-CRYSTAL PORTION

TECHNICAL FIELD

The field of the invention is that of optoelectronic devices comprising three-dimensional semiconductor structures, such as nanowires or microwires, suitable for emitting or detecting light.

PRIOR ART

Optoelectronic devices exist that comprise three-dimensional semiconductor structures of the nanowire or microwire type forming for example light-emitting diodes. The nanowires or microwires usually comprise a first doped portion, for example of n type, of wire shape, and a second doped portion with the opposite type of conductivity, for example of p-type, between which there is an active zone comprising at least one quantum well.

The nanowires or microwires may be made in a so-called axial configuration, in which the active zone and the second p-doped portion extend essentially in the prolongation of the first doped portion, along a longitudinal axis of epitaxial growth, without surrounding the periphery of the latter. They may also be made in a so-called radial configuration, also called core/shell, in which the active zone and the second p-doped portion surround one end of the first n-doped portion.

The nanowires or microwires in a radial configuration may, however, have a lattice mismatch between the semiconductor compound forming the active zone and that forming the first doped portion. This lattice mismatch may lead to degradation of the electronic and/or optical properties of the nanowires or microwires.

DESCRIPTION OF THE INVENTION

The aim of the invention is to remedy, at least partly, the drawbacks of the prior art. For this purpose, the invention relates to an optoelectronic device, comprising at least one three-dimensional semiconductor structure extending along a longitudinal axis substantially orthogonal to a plane of a substrate on which it lies, and comprising a first doped portion, extending from the substrate along the longitudinal axis, and made of a first semiconductor compound; an active zone comprising at least one quantum well, and extending from the first doped portion; a second doped portion, at least partly covering the active zone.

According to the invention, the active zone comprises a wider single-crystal portion formed from a single crystal of a second semiconductor compound formed from a mixture of the first semiconductor compound and of at least one additional element; extending from an upper face of one end of the first doped portion opposite the substrate; and having an average diameter greater than that of the first doped portion.

Moreover, the active zone is produced on the basis of said second semiconductor compound. In other words, the active zone is made of one or more semiconductor materials, each comprising at least the same elements as those of the second semiconductor compound. Therefore it does not comprise a layer made of the first semiconductor compound. Preferably, it consists of at least one semiconductor compound comprising at least the same elements as the first semiconductor compound and at least the additional element.

Thus, the lattice mismatch in the active zone is limited by the fact that it is produced on the basis of the same semiconductor compound. The greatest lattice mismatch is then shifted to the interface between the first semiconductor compound of the first doped portion and the second semiconductor compound of the single crystal. It is then possible to produce an active zone of larger thickness and/or with a higher atomic proportion of the additional element, whereas the first doped portion is made of the first semiconductor compound.

"Mixture" means an alloy, and preferably a ternary alloy, formed from the first semiconductor compound, for example GaN, and the additional element, for example indium. In this example, the second semiconductor compound is InGaN.

Certain preferred but nonlimiting aspects of this optoelectronic device are as follows.

The active zone may comprise multiple quantum wells that cover at least part of the wider single-crystal portion. The multiple quantum wells may be formed from alternating barrier layers and layers forming quantum wells, said barrier layers and quantum wells being produced on the basis of the second semiconductor compound. The barrier layers have a first nonzero value of atomic proportion of said additional element of the second semiconductor compound. The quantum wells have a second value of atomic proportion of said additional element higher than the first value.

Thus, the lattice mismatch between the multiple quantum wells produced on the basis of the second semiconductor compound and the first doped portion made of the first semiconductor compound is limited. By limiting the lattice mismatch, it is possible to produce quantum wells of larger thickness and/or with a higher atomic proportion of the additional element.

Preferably, the second semiconductor compound of the wider single-crystal portion may be doped with the same type of conductivity as that of the first doped portion.

Preferably, the first semiconductor compound is gallium nitride and the second semiconductor compound is gallium indium nitride.

Preferably, the first value of atomic proportion of said additional element of the barrier layers is between 15% and 23%, and the second value of atomic proportion of said additional element of the quantum wells is between 22% and 30%. Thus, in the case when the first semiconductor compound is GaN and the second semiconductor compound is InGaN, it is possible to produce quantum wells whose atomic proportion of indium makes it possible to emit light in the green, i.e. whose emission spectrum has an intensity peak at a wavelength between 495 nm and 560 nm, for example equal to about 530 nm, while having an improved internal quantum efficiency, whereas the first doped portion is made of GaN.

Preferably, the single crystal has an atomic proportion of said additional element equal to that of the barrier layer in contact with the latter. Thus, the lattice mismatch between the single crystal and the barrier layer in contact with the latter is limited, the greatest lattice mismatch being shifted to the interface between the first semiconductor compound of the first doped portion and the second semiconductor compound of the single crystal, which makes it possible to limit the mechanical stresses between the single crystal and the barrier layer in contact. It is then possible to produce quantum wells of larger thickness and/or with a higher atomic proportion of the additional element.

The wider single-crystal portion may have an average thickness, along the longitudinal axis, greater than 10 nm.

The wider single-crystal portion may have an average diameter greater than 110% of the average diameter of the first doped portion.

Said quantum well may be made of a semiconductor material based on the second semiconductor compound.

The first semiconductor compound may be selected from the III-V compounds, the II-VI compounds and the IV elements or compounds, and is preferably a III-N compound.

The second doped portion may be at least partly surrounded by a polarizing electrode.

The wider single-crystal portion may form a single quantum well, the second semiconductor compound preferably being unintentionally doped.

The wider single-crystal portion may have at least two semipolar faces with different inclinations relative to the longitudinal axis, said semipolar faces being covered by at least one quantum well covered by the second doped portion.

The optoelectronic device may comprise at least two polarizing electrodes each suitable for polarizing a part of the second doped portion located at the level of one or other of said semipolar faces.

The invention also relates to a method for making an optoelectronic device according to any one of the preceding features, in which the three-dimensional semiconductor structure is formed by chemical vapor deposition, the first semiconductor compound being a III-V compound.

Preferably, during formation of the first doped portion, a ratio V/III of a flux of the precursor gas of element V to a flux of the precursor gas of element III has a value less than or equal to 100, and in which during formation of the wider single-crystal portion, said ratio V/III has a value greater than or equal to 500.

Preferably, during formation of the first doped portion, a ratio $H_2/N_2$ of a proportion of molar flux of hydrogen to a proportion of molar flux of nitrogen has a value greater than or equal to 60/40, preferably greater than or equal to 70/30, and in which during formation of the wider single-crystal portion, said ratio $H_2/N_2$ has a value less than or equal to 40/60, preferably less than or equal to 30/70.

BRIEF DESCRIPTION OF THE DRAWINGS

Other aspects, aims, advantages and features of the invention will become clearer on reading the following detailed description of preferred embodiments of the latter, given as nonlimiting examples, and made with reference to the appended drawings, in which.

DETAILED DESCRIPTION OF PARTICULAR EMBODIMENTS

In the figures and in the rest of the description, the same references represent identical or similar elements. Moreover, the various elements are not shown to scale, for the sake of clarity of the figures. Moreover, the terms "substantially", "approximately", and "about" mean "to within 10%".

The invention relates to an optoelectronic device comprising three-dimensional semiconductor structures suitable for forming light-emitting diodes or photodiodes.

The three-dimensional semiconductor structures have an elongated shape along a longitudinal axis Δ, i.e. whose longitudinal dimension along the longitudinal axis Δ is greater than the transverse dimensions. The three-dimensional structures are then called "wires", "nanowires" or "microwires". The transverse dimensions of the wires, i.e. their dimensions in a plane orthogonal to the longitudinal axis Δ, may be between 100 nm and 10 μm, for example between 100 nm and 10 μm, and preferably between 100 nm and 5 μm. The height of the wires, i.e. their longitudinal dimension along the longitudinal axis Δ, is greater than the transverse dimensions, for example 2 times, 5 times and preferably at least to times greater.

The cross section of the wires, in a plane orthogonal to the longitudinal axis Δ, may have various shapes, for example a circular, oval, polygonal for example triangular, square, rectangular or even hexagonal shape. The diameter is defined here as a quantity associated with the perimeter of the wire at the level of a cross section. It may be the diameter of a disk having the same area as the cross section of the wire. The local diameter is the diameter of the wire at a given height of the latter along the longitudinal axis Δ. The average diameter is the mean value, for example the arithmetic mean, of the local diameters along the wire or a portion of the latter.

Figure 1:
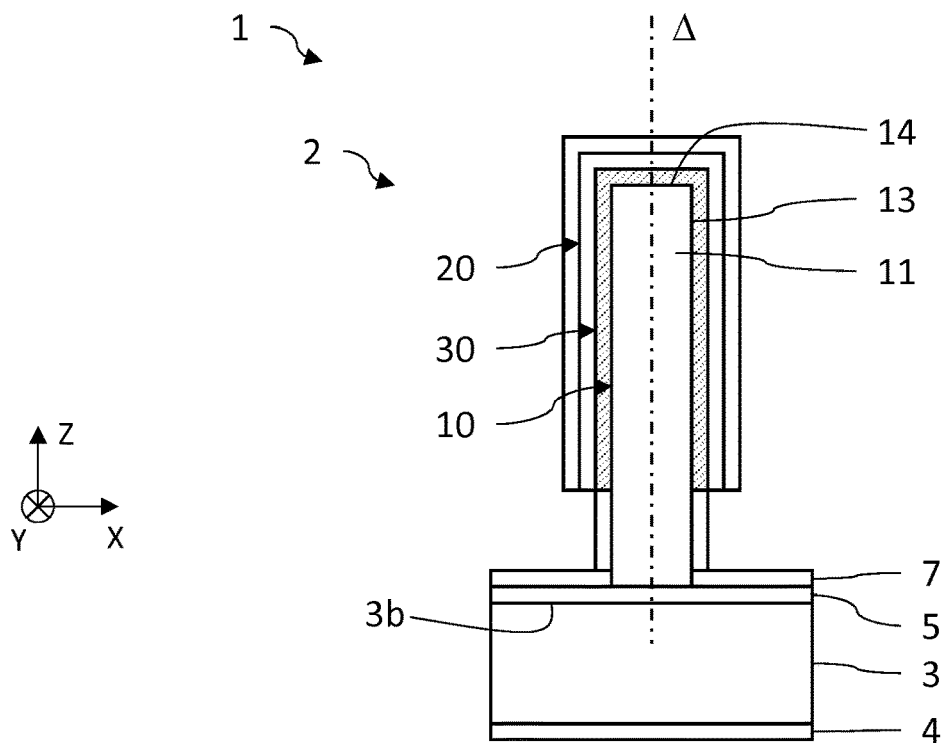
FIG. 1 is a partial, schematic, cross-sectional view of an example of optoelectronic device comprising nanowires or microwires in a radial configuration.

FIG. 1 shows schematically a partial sectional view of an example of optoelectronic device 1 comprising three-dimensional semiconductor structures 2 forming wire-type light-emitting diodes in a radial configuration.

Here, and for the rest of the description, an orthonormal three-dimensional coordinate system (X,Y,Z) is defined, where the (X,Y) plane is substantially parallel to the plane of a substrate of the optoelectronic device, the Z axis being oriented in a direction substantially orthogonal to the plane of the substrate.

In this example, a first portion 10, doped with a first type of conductivity, is in the form of a wire that extends along a longitudinal axis Δ, the latter being oriented substantially orthogonally to the (X,Y) plane of a front face 3b of a substrate 3. The end 11 of the first doped portion 10, opposite the substrate 3, is covered, at the level of its upper edge 14 and of its lateral edge 13, with a layer or a stack of layers forming an active zone 30 that comprises at least one quantum well. The active zone 30 is itself covered with a layer forming a second portion 20, doped with a second type of conductivity opposite to the first type. The first doped portion 10 and the second doped portion 20 form the core and the shell respectively of the wire 2 in a so-called core/shell configuration.

The wire 2 is made on the basis of a first semiconductor compound, for example GaN. Thus, the first and second doped portions 10, 20 may be made of doped GaN of n-type and p-type, respectively. The active zone 30 comprises at least one quantum well in the form of a layer located between the first and second doped portions 10, 20, and made of a second semiconductor compound formed from a mixture of the first semiconductor compound and of at least one additional element, for example InGaN, so that its bandgap energy is lower than those of the first and second doped portions 10, 20. The layer forming the quantum well may be arranged between two barrier layers, ensuring better confinement of the charge carriers.

The inventors have identified a drawback that arises from the lattice mismatch between the first semiconductor compound of the first doped portion, here GaN, and the second semiconductor compound of the active zone, here InGaN. This lattice mismatch may be reflected in the appearance of structural defects at the interface between the first and second semiconductor compounds, defects that may degrade the electronic and/or optical properties of the active zone. The lattice mismatch is the relative difference between the lattice parameter $a_{c2}$ of the second semiconductor compound and the lattice parameter $a_{c1}$ of the first semiconductor compound, and may be expressed by the parameter $\Delta a/a = (a_{c2}-a_{c1})/a_{c2}$. The second semiconductor compound grows with a lattice parameter substantially equal to that of the first semiconductor compound but undergoes a deformation of its crystallographic structure that is reflected in the generation of mechanical stresses, notably in compression or in tension. Starting from a so-called critical thickness, of the order of 10 nm, the stresses acting on the second semiconductor compound may be relieved, causing the appearance of structural defects, for example so-called lattice mismatch dislocations localized at the interface between the first and second semiconductor compounds, then leading to degradation of the electronic and/or optical properties of the wire.

The lattice mismatch between the first and second semiconductor compounds then introduces a constraint in terms of thickness of the second semiconductor compound, and/or in terms of atomic proportion of the additional element in the second semiconductor compound. These drawbacks will notably limit the production of light-emitting diodes able to emit at high wavelengths, for example in the green or the red, as well as the production of light-emitting diodes with an active zone of large thickness.

Figure 2:
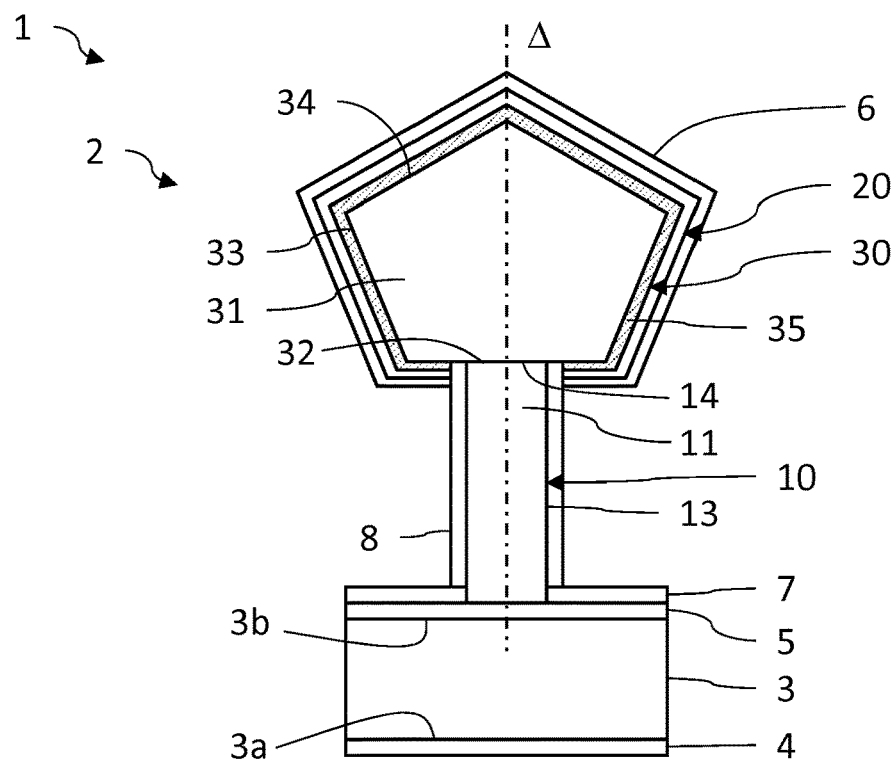
FIG. 2 is a partial, schematic, cross-sectional view of a first embodiment of an optoelectronic device comprising nanowires or microwires in a radial configuration and whose active zone comprises a wider single-crystal portion surrounded by multiple quantum wells.
Figure 3:
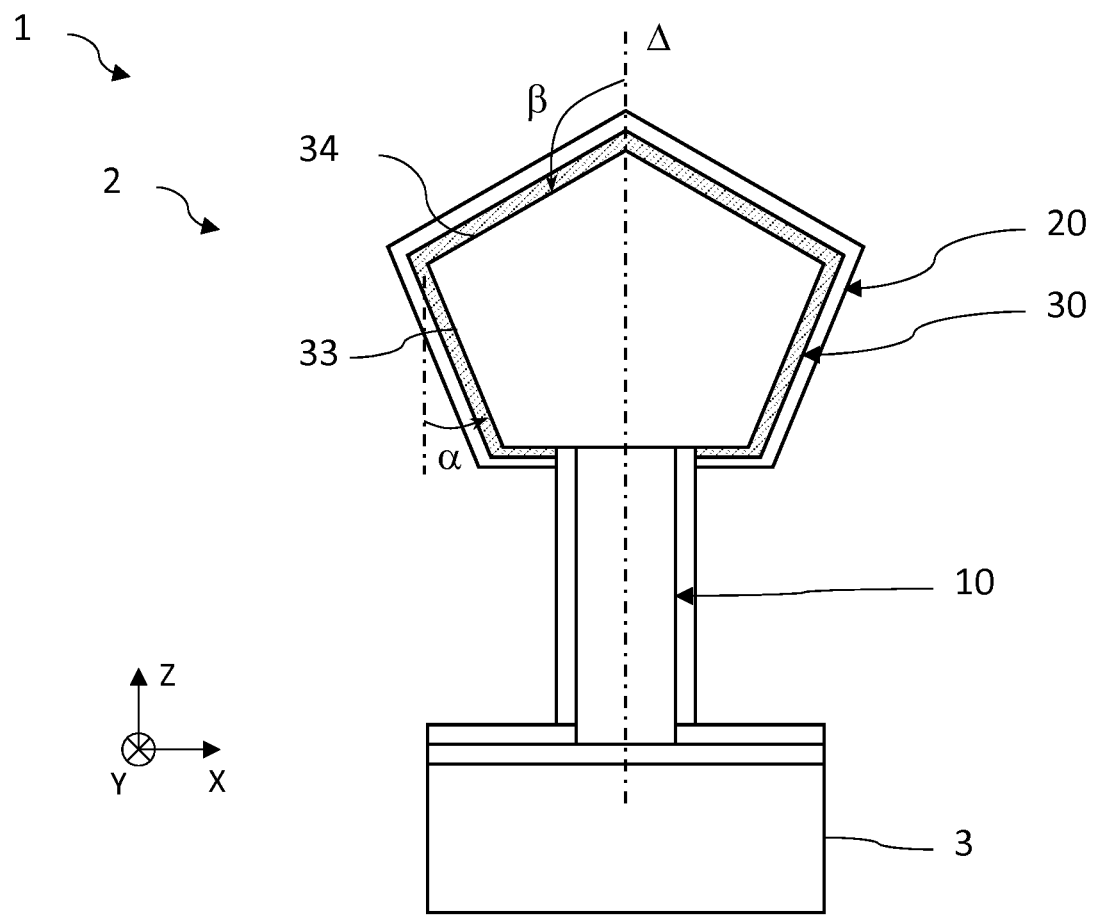
FIG. 3 is a partial, schematic, cross-sectional view of the optoelectronic device shown in FIG. 2, illustrating the angles of inclination α and β that form the lateral and upper edges respectively, with respect to the longitudinal axis Δ of the wire.

FIGS. 2 and 3 show schematically a partial sectional view of a first embodiment of an optoelectronic device 1 comprising three-dimensional semiconductor structures 2 forming wire-type light-emitting diodes in a radial configuration.

In this example, the optoelectronic device 1 comprises:
  a substrate 3, for example made of a semiconductor material, having two faces, called rear face 3a and front face 3b, opposite one another;
  a first polarizing electrode 4, here in contact with the rear face 3a of the substrate;
  a nucleation layer 5, made of a material suitable for epitaxial growth of the three-dimensional semiconductor structures, covering the front face 3b of the substrate;
  at least one three-dimensional semiconductor structure 2, here in the form of a wire, which extends from the nucleation layer 5 along a longitudinal axis Δ oriented substantially orthogonally to the (X,Y) plane of the front face 3b of the substrate 3, said wire 2 comprising a first doped portion 10 in contact with the nucleation layer 5, an active zone 30 and a second doped portion 20;
  a layer of second polarizing electrode 6, in contact with the second doped portion 20.

The wire 2 shown here has a radial configuration, or core/shell configuration, with the second doped portion 20 surrounding and covering, at least partly, the active zone 30, and notably the lateral edge of the latter. It therefore has a configuration that differs from the axial configuration in which the n-doped portion, the active zone and the p-doped portion are stacked on one another along the longitudinal axis of the wire, without the lateral edge of the active zone being substantially covered by the p-doped portion.

Lateral edge or upper edge means a surface of a part of the wire that extends substantially parallel or orthogonally, respectively, to the longitudinal axis Δ. A lateral edge may also be called a radial edge, or a lateral flank. An upper edge may also be called an axial edge.

As illustrated in FIG. 3, the lateral edges may be inclined when they form a nonzero angle of inclination α with the longitudinal axis Δ. As an example, here the edge 33 of the active zone 30 is said to be inclined, as it forms an angle of inclination α with respect to the longitudinal axis Δ different from 0°, and in particular strictly greater than 0° and strictly less than 90°, or strictly less than 0° and strictly greater than −90°. Similarly, an upper edge, for example here the edge 34 of the active zone 30, is said to be inclined when it forms an angle of inclination β with respect to the longitudinal axis Δ different from 90°, and in particular strictly greater than 90° and strictly less than 180°, or strictly less than 90° and strictly greater than 0°.

The substrate 3 is in this case a semiconductor structure, for example of silicon. It may be one-piece or formed from a stack of layers such as a substrate of the SOI type (acronym of Silicon On Insulator). More broadly, the substrate may be made of a semiconductor material, for example of silicon, germanium, silicon carbide, or of a III-V or II-VI compound. It may also be made of a metallic material or an insulating material. It may comprise a layer of graphene, of molybdenum sulfide or selenide ($MoS_2$, $MoSe_2$), or of any other equivalent material. In this example, the substrate is made of highly doped n-type single-crystal silicon.

The first polarizing electrode 4 is in contact with the substrate 3, here electrically conducting, for example at the level of its rear face 3a. It may be made of aluminum or of any other suitable material.

The nucleation layer 5 is made of a material that promotes the nucleation and growth of the wires, for example of aluminum nitride (AlN) or of aluminum oxide ($Al_2O_3$), magnesium nitride ($Mg_xN_y$), nitride or carbide of a transition metal or of any other suitable material. The thickness of the nucleation layer may be of the order of a few nanometers or some tens of nanometers. In this example, the nucleation layer is of AlN.

The first doped portion 10 of the wire rests on the substrate 3 at the level of the nucleation layer 5. It is wire-shaped and extends along the longitudinal axis Δ, forming the core of the wire in a core/shell configuration. It has an end 11, opposite the substrate, delimited longitudinally by a so-called upper face 14. Here, the upper face 14 extends substantially orthogonally to the longitudinal axis Δ but may be inclined with respect to the axis Δ, or may even be formed from one or more faces, which are then called elementary.

The first doped portion 10 is made of a first semiconductor compound, which may be selected from the III-V compounds comprising at least one element from column III and at least one element from column V of the periodic table, from the II-VI compounds comprising at least one element from column II and at least one element from column VI, or from the IV elements or compounds comprising at least one element from column IV. As an example, III-V compounds may be III-N compounds, such as GaN, InGaN, AlGaN, AlN, InN or AlInGaN, or even compounds comprising an element from column V of the arsenic or phosphorus type, for example AsGa or InP. Moreover, II-VI compounds may be CdTe, HgTe, CdHgTe, ZnO, ZnMgO, CdZnO or CdZnMgO. Finally, IV elements or compounds may be used, such as Si, C, Ge, SiC, SiGe, or GeC. The first portion is doped according to a first type of conductivity.

In this example, the first doped portion 10 is made of doped GaN of the n-type, notably with silicon. Here, the first doped portion 10 has an average diameter substantially equal to the local diameter. The average diameter of the first doped portion 10 may be between 10 nm and 10 μm, for example between 500 nm and 5 μm, and here is substantially equal to 1 μm. The height of the first doped portion may be between 100 nm and 10 μm, for example between 500 nm and 5 μm, and here is substantially equal to 5 μm.

In this example, here a dielectric layer 7 covers the nucleation layer 5 and forms a growth mask allowing epitaxial growth of the wires starting from openings that open locally onto the nucleation layer, and a second dielectric layer 8 covers the lateral edge of the first doped portion 10.

The active zone 30 is the portion of the wire 2 at the level of which most of the light is emitted from the wire. It comprises at least one quantum well made of a semiconductor compound having a bandgap energy lower than those of the first doped portion 10 and of the second doped portion 20. It extends from the end 11 of the first doped portion 10 and more precisely starting from the upper face 14. As described in detail hereunder, the active zone 30 may comprise a single quantum well or multiple quantum wells in the form of layers or dots inserted between barrier layers.

The active zone 30 comprises a so-called wider single-crystal portion 31 that extends along the longitudinal axis Δ starting from the upper face 14 of the end 11 of the first doped portion 10.

The wider single-crystal portion 31 is formed from a single crystal of a second semiconductor compound, different than the first semiconductor compound in the sense that it comprises at least one additional element not contained in the first compound. The second compound is thus formed from a mixture of the first compound and of at least one additional element. The atomic proportion of the additional element is selected as a function of the required optical and/or electronic properties and notably of the emission spectrum of the wire. As an example, in the case of a first doped portion 10 made of GaN, the second compound is preferably InGaN, of general formula $In_xGa_{(1-x)}N$, with for example an atomic percentage of indium of the order of 18%. The second semiconductor compound of the wider single-crystal portion 31 may be unintentionally doped, or doped according to the same type of conductivity and optionally at the same doping level as the first doped portion 10.

The wider single-crystal portion 31 is formed from a single crystal of the second semiconductor compound, delimited by a base 32 in contact with the upper face 14 of the first doped portion 10, a lateral edge 33 and an upper edge 34. As described in detail hereunder, the lateral edge 33 and upper edge 34 may have semipolar faces, i.e. faces inclined with respect to the longitudinal axis Δ.

The single-crystal portion 31 is called wider as it has an average diameter greater than the average diameter of the first doped portion 10. It thus has an average diameter that may be between 1.1 and 20 times the average diameter of the first doped portion 10, for example between 2 and to times the average diameter of the first doped portion 10, and here is substantially equal to 5 μm.

Moreover, the wider single-crystal portion 31 may have an average thickness greater than 10 nm, which is the order of magnitude of the critical thickness of the second semiconductor compound, here InGaN. The local thickness is the thickness of the wider single-crystal portion 31 along a given axis parallel to the longitudinal axis Δ starting from the upper surface of the first doped portion. The average thickness is the mean value, for example the arithmetic mean, of the local thicknesses. The average thickness may be between 10 nm and 20 μm, for example between 500 nm and 10 μm, and here is substantially equal to 5 μm.

The active zone 30 comprises at least one quantum well, which here at least partly covers the wider single-crystal portion 31, and in particular its lateral edge 33 and upper edge 34. In this example, the active zone comprises multiple quantum wells 35 that are in the form of a stack of layers, of which one or more layers form quantum wells inserted between two barrier layers.

The layers forming the quantum wells, and preferably also the barrier layers, are made of a semiconductor material based on the second semiconductor compound, i.e. comprising at least the same elements as the second semiconductor compound, here of InGaN. They are preferably made of the same second semiconductor compound, with different mole fractions for the barrier layers and for the quantum wells.

The barrier layers may thus be made of $In_{x1}Ga_{1-x1}N$ with an atomic proportion of indium x1 between about 15% and 23%, for example equal to about 18%, and the layers forming the quantum wells may be made of $In_{x2}Ga_{1-x2}N$ with an atomic proportion of indium x2 between about 22% and 30%, for example equal to about 25%, here making it possible to obtain an emission wavelength between about 495 nm and 560 nm, for example equal to about 500 nm. The atomic proportion x2 is greater than the atomic proportion x1. The light-emitting diode is then able to emit light in the green, with good luminous efficiency since the internal quantum efficiency is improved owing to the fact that the lattice mismatch is limited between the single-crystal portion made of InGaN and the multiple quantum wells even though the first doped portion is made of GaN. Preferably, the single-crystal portion made of InGaN has an atomic proportion equal to that of the barrier layer that is in contact with it.

The second doped portion 20 forms a layer that covers and surrounds at least partly the active zone 30, i.e. here the wider single-crystal portion 31 and the multiple quantum wells 35. It is made of a doped semiconductor compound with a second type of conductivity opposite to the first type. The semiconductor compound may be the first semiconductor compound, namely here GaN, or preferably the second semiconductor compound, namely here InGaN. It may also comprise one or more additional elements. In this example, the second doped portion 20 is made of InGaN, with p-type doping, notably with magnesium. The thickness of the second doped portion may be between 20 nm and 500 nm, for example of the order of 150 nm.

The second doped portion 20 may comprise an electron blocking layer (not shown) located at the interface with the active zone 30. Here, the electron blocking layer may be formed from a III-N ternary compound, for example AlGaN or AlInN, advantageously p-doped. It makes it possible to increase the level of radiative recombinations within the active zone.

Here, the second polarizing electrode 6 covers the second doped portion 20 and is suitable for applying electric polarization to the wire 2. It is made of a material that is substantially transparent to the light emitted by the wire, for example indium tin oxide (ITO). It has a thickness from a few nanometers to some tens or hundreds of nanometers.

Thus, when a potential difference is applied to the wire 2 in a forward direction via the two polarizing electrodes, the wire 2 emits light whose emission spectrum has an intensity peak at a wavelength that mainly depends on the composition of the quantum well or wells.

It can thus be seen that the wire, in a radial configuration, comprises an active zone with a quantum well comprising a wider single-crystal portion, the latter resting on an upper face of the first doped portion, said upper face thus forming a nucleus for the wider single-crystal portion.

Thus, despite the lattice mismatch between the first semiconductor compound of the first doped portion and the second semiconductor compound of the wider single-crystal portion, the latter has a crystallographic structure that is substantially relaxed, i.e. not stressed, its lattice parameter being substantially identical to the natural lattice parameter of the compound. This is explained by the fact that in contrast to the wire described with reference to FIG. 1, the area allowing nucleation of the wider single-crystal portion is reduced and is less than the average diameter of the single-crystal portion.

The wider single-crystal portion then has good crystal quality, with a limited density of structural defects. The density of structural defects, i.e. the number of defects per unit volume, decreases in particular with increase in volume of the wider single-crystal portion. In fact, the structural defects, of the dislocation type, essentially result from plastic relaxation of the second semiconductor compound in the nucleation zone starting from the upper face of the first doped portion, and are not generated to any appreciable extent by the widening of the wider single-crystal portion.

Thus, the active zone may comprise at least one quantum well, made of a material based on the second semiconductor compound, and that rests on the wider single-crystal portion or that is formed by the latter. Thus, the effects of the lattice mismatch between the first semiconductor compound of the first doped portion and the semiconductor material forming the quantum well or wells are limited in the active zone, in particular at the level of the quantum well or wells. The quantum well or wells then have an improved crystal quality and therefore an increased internal quantum efficiency.

It is then possible to reduce or even dispense with the limits mentioned with reference to FIG. 1, relating to the thickness of the quantum wells and/or the atomic proportion of the additional element. It is in fact possible to produce an active zone in which the quantum well or wells have a large thickness, greater than the critical thickness, and/or have a high atomic proportion of the additional element, in this case indium.

Finally, in the example in FIG. 2, the multiple quantum wells cover and surround at least partly the wider single-crystal portion, which makes it possible to obtain a larger emission area. This increased emission area, combined with the optimized internal quantum efficiency, also makes it possible to increase the optical efficiency of the wire, which is defined as the ratio of the luminous flux emitted to the electric power absorbed.

When the active zone is formed on the basis of the second semiconductor compound, for example on the basis of InGaN, the mechanical stresses are limited in the active zone even though the first doped portion is made of the first semiconductor compound, for example of GaN. The best quantum efficiency is thus improved. It is possible to make an active zone of larger thickness and/or incorporate more additional element of the second semiconductor compound, for example indium in the case of InGaN.

In the case when the active zone is formed of the multiple quantum wells 35 that cover at least part of the wider single-crystal portion 31, formed from alternating barrier layers having a nonzero first value $In_{x1}$ of atomic proportion of indium and of layers forming quantum wells having a second value $In_{x2}$ of atomic proportion of indium higher than the first value $In_{x1}$, it is possible to produce an active zone whose value x1 is between 15% and 23% and whose value x2 is between 22% and 30%, even though the first doped portion is made of GaN. The diode is able to emit light in the green, with good luminous efficiency as the internal quantum efficiency has been improved.

An example of a method for making the optoelectronic device illustrated in FIG. 2 is now described. In this example, the wire 2 is produced by epitaxial growth by metal-organic chemical vapor deposition (MOCVD) and is here on the basis of GaN.

In the context of epitaxial growth of the MOCVD type, the parameters having an influence on epitaxial growth are notably:

the nominal V/III ratio, defined as the ratio of the molar flux of elements from column V to the molar flux of elements from column III, i.e. here the ratio N/Ga during growth of the first doped portion made of GaN, and the ratio N/(Ga+In), during growth of the wider single-crystal portion and the multiple quantum wells made of InGaN;

the $H_2/N_2$ ratio, defined as the ratio of the proportion of molar flux of $H_2$ in the $H_2$ and $N_2$ carrier gas, namely $\varphi_{H2}/(\varphi_{H2}+\varphi_{N2})$, to the proportion of molar flux of $N_2$, namely $\varphi_{N2}/(\varphi_{H2}+\varphi_{N2})$, $\varphi_{H2}$ and $\varphi_{N2}$ being the molar fluxes of hydrogen and of nitrogen, respectively;

the growth temperature T, measured here at the level of the substrate.

During a first step, the first doped portion 10 is formed by epitaxial growth starting from the nucleation layer 5. Epitaxial growth may be carried out starting from openings formed in a growth mask 7 made of a dielectric material, for example $Si_3N_4$, deposited beforehand on the nucleation layer 5.

The growth temperature is raised to a first value $T_1$, for example between 950° C. and 1100° C., and notably between 990° C. and 1060° C. The nominal V/III ratio, here the ratio N/Ga, has a first value (V/III)$_1$ between about 10 and 100, for example substantially equal to 30. The group III and group V elements are derived from precursors injected in the epitaxy reactor, for example trimethylgallium (TMGa) or triethylgallium (TEGa) for gallium, and ammonia (NH$_3$) for nitrogen. The $H_2/N_2$ ratio has a first value $(H_2/N_2)_1$ greater than or equal to 60/40, preferably greater than or equal to 70/30, or even higher, for example substantially equal to 90/10. The pressure may be fixed at about 800 mbar.

Thus, a first doped portion 10 is obtained that is in the shape of a wire that extends along the longitudinal axis Δ. The first semiconductor compound of the first doped portion 10, namely GaN here, is doped n-type with silicon. Here, the first doped portion 10 has a height of about 5 μm and an average diameter of about 1 μm. It has an upper face 14, opposite the substrate 3 and oriented along the crystallographic axis c, substantially flat. This upper face 14 forms the axial face 14 of the end of the first doped portion, and performs the function of nucleation surface for formation of the wider single-crystal portion.

Formation of a dielectric layer 8 covering the lateral edge 13 of the first doped portion 10 may be carried out simultaneously with formation of the first doped portion. For this, a precursor of an additional element, for example silane ($SiH_4$) in the case of silicon, is injected with the precursors mentioned above, with a ratio of the molar fluxes of the gallium precursor to the silicon precursor preferably between about 500 and 5000. In this way we obtain a layer 8 of silicon nitride, for example $Si_3N_4$ with a thickness of the order of 10 nm, which covers the lateral edge 13 of the first doped portion, here over its full height.

In a second step, the wider single-crystal portion 31 is formed by epitaxial growth starting from the upper face 14 of the first doped portion 10.

The growth temperature is adjusted to a second value $T_2$ below the value $T_1$, for example between 700° C. and 800° C., here equal to about 750° C. So as to form a second semiconductor compound comprising the elements of the first compound as well as at least one additional element, injection of the precursors of the III and V elements is maintained and a precursor of the additional element is added, for example trimethylindium (TMIn) in the case of indium. The nominal V/III ratio has a second value $(V/III)_2$ above the value $(V/III)_1$, for example between about 500 and 5000, here substantially equal to 1500. Moreover, the $H_2/N_2$ ratio has a second value $(H_2/N_2)_2$ lower than the value $(H_2/N_2)$, and less than or equal to 40/60, preferably less than or equal to 30/70, or more, for example substantially equal to 3/97. Moreover, the pressure may stay the same, and injection of the silicon precursor is stopped beforehand.

Thus, a single-crystal portion 31 of the second semiconductor compound is obtained, here InGaN with an atomic proportion of indium of the order of 18%, by epitaxial growth starting from the upper face 14 of the first doped portion 10. Moreover, the increase in the value of the V/III ratio, combined with the decrease in the $H_2/N_2$ ratio, leads to widening of the single-crystal portion of InGaN. The wider single-crystal portion may be unintentionally doped, but is advantageously doped according to the same type of conductivity and preferably at the same doping level as the first doped portion 10, thus limiting the series resistance associated with the portions 10, 31.

In a third step, multiple quantum wells 35 are formed by epitaxial growth starting from the wider single-crystal portion 31, here at the level of the lateral edge 33 and upper edge 34.

More precisely, a stack is formed from barrier layers and at least one layer forming a quantum well, with said layers alternating in the direction of epitaxial growth. The layers forming the quantum wells and the barrier layers are advantageously made of a semiconductor compound that comprises the same elements as the second semiconductor compound, namely InGaN here, with different atomic proportions for the layers of quantum wells and the barrier layers. As an example, the barrier layers are made of the second semiconductor compound, here $In_xGa_{(1-x)}N$ with x equal to about 18 at %, and the layers of quantum wells are also made of $In_yGa_{(1-y)}N$, with y greater than x, for example of the order of 25 at %, so as to improve the quantum confinement of the charge carriers in the quantum wells.

Formation of the barrier layers and of the layers of quantum wells may be carried out at a value $T_3$ of growth temperature substantially equal to the value $T_2$, namely 750° C. here. The V/III ratio has a value $(V/III)_3$ substantially equal to the value $(V/III)_2$. The $H_2/N_2$ ratio has a value substantially equal to the value $(H_2/N_2)$ during formation of the barrier layers and has a value appreciably lower than the value $(H_2/N_2)_2$ during formation of the layers of quantum wells, for example 1/99. The pressure may remain unchanged. Barrier layers of InGaN are thus obtained with about 18 at % of indium and layers of quantum wells of InGaN with about 25 at % of indium.

In a fourth step, the second doped portion 20 is formed by epitaxial growth so that the active zone 30 is at least partly covered and surrounded.

For this, the growth temperature may be adjusted to a fourth value $T_4$ above the value $T_3$, for example of the order of 885° C. The V/III ratio may be adjusted to a fourth value $(V/III)_4$ above the value $(V/III)_3$, for example of the order of 4000. The $H_2/N_2$ ratio is adjusted to a fourth value $(H_2/N_2)_4$ above the value $(H_2/N_2)_2$, for example of the order of 15/85. Finally, the pressure may be lowered to a value of the order of 300 mbar.

A second doped portion 20 is thus obtained, for example of p-type doped GaN or InGaN, which in this case covers and surrounds the active zone 30o continuously, i.e. the multiple quantum wells as well as the wider single-crystal portion. The second doped portion thus forms the shell of the wire with a core/shell configuration.

Finally, the second polarizing electrode 6 may be deposited so as to be in contact with at least part of the second doped portion 20. The second electrode 6 is made of an electrically conducting material that is transparent to the light emitted by the wires. Thus, application of a direct potential difference to the wires by the two polarizing electrodes leads to emission of light, for which the properties of the emission spectrum depend on the composition of the quantum well or wells in the active zone.

According to one embodiment, as shown in FIGS. 2 and 3, the wider single-crystal portion 31 has semipolar faces, formed by the lateral edge 33 and the upper edge 34. The lateral and upper edges form faces that are inclined with respect to the longitudinal axis Δ and correspond to semipolar crystal planes. Thus, the inclined lateral edge corresponds to adjacent crystal planes of the type (30-3-2) inclined by an angle α of about 20° relative to the longitudinal axis Δ, and the inclined upper edge corresponds to adjacent crystal planes of the type (10-13) inclined by an angle β of about 120° relative to the longitudinal axis Δ.

The difference in inclination between the different semipolar faces 33, 34 leads to the formation of layers of quantum wells that differ from one another in thickness and/or the atomic proportion of the elements. In fact, in the case of a layer forming a quantum well made of InGaN, the level of incorporation of indium and/or the thickness of the layer formed are different depending on whether deposition is carried out on a more or less inclined face with respect to the longitudinal axis Δ. This is then reflected in differences of optical properties, notably a difference of emission wavelength, between the quantum wells resting on the semipolar faces. The light emitted by such a wire may then have a widened emission spectrum when it comes from the quantum wells located on the different semipolar faces.

Figure 4:
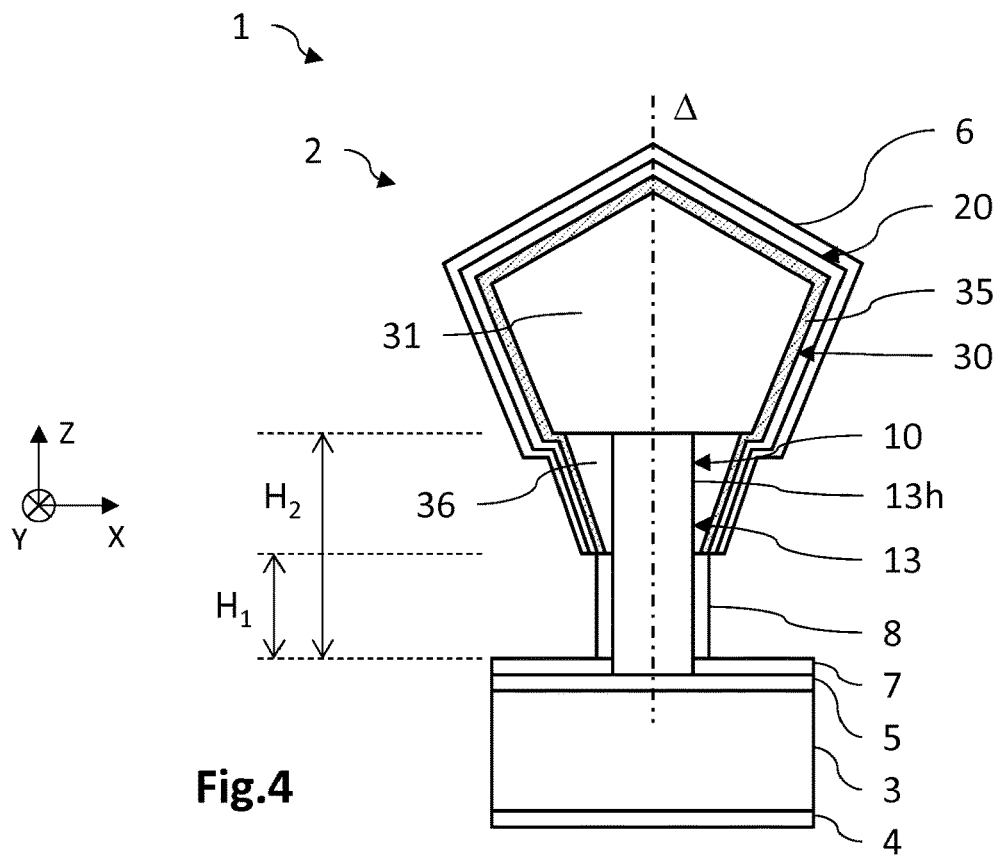
FIG. 4 is a partial, schematic, cross-sectional view of a variant of the first embodiment of an optoelectronic device.

FIG. 4 shows schematically a partial sectional view of a variant of the first embodiment of an optoelectronic device 1 comprising three-dimensional semiconductor structures 2 forming wire-type light-emitting diodes in a radial configuration and with multiple quantum wells.

The optoelectronic device 1 differs from that shown in FIG. 2 essentially in that the dielectric layer 8 covering the lateral edge 13 of the first doped portion 10 does not extend over the full height of the latter. In this example, the dielectric layer 8 extends from the nucleation layer 5 over a height $H_1$ less than the height $H_2$ of the first doped portion 10. "Height" means the longitudinal extent, along the longitudinal axis Δ, of a layer or portion. Thus, a so-called upper zone 13h of the lateral edge 13 of the first doped portion 10, which extends from the height $H_1$ to the height $H_2$, is not covered by the dielectric layer 8, and is called the free zone.

During epitaxial formation of the wider single-crystal portion 31, a second wider portion 36 may be formed from the lateral edge 13 of the first doped portion 10, at the level of the free zone 13h. This second wider portion 36 is also made of the second semiconductor compound and has an average diameter greater than the average diameter of the first doped portion. In this case it is covered by the multiple quantum wells 35, by the second doped portion 20 and by the second polarizing electrode 6.

This second wider portion 36 is formed by epitaxial growth starting from the free zone 13h of the lateral edge 13 of the first doped portion 10, and accordingly is subject to mechanical stresses associated with the lattice mismatch with the first semiconductor compound, as it has a large nucleation surface with the first doped portion 10. Thus, the crystal quality of the second wider portion 36 is less than that of the wider single-crystal portion 31.

As a variant (not shown), the wire 2 need not comprise a dielectric layer 8 at least partly covering the lateral edge 13 of the first doped portion 10. The second wider portion 36 may then cover the lateral edge 13 of the first doped portion, over nearly the full height $H_2$. The growth mask 7, advantageously dielectric, then provides electrical insulation between the second polarizing electrode and the conductive substrate.

Figure 5:
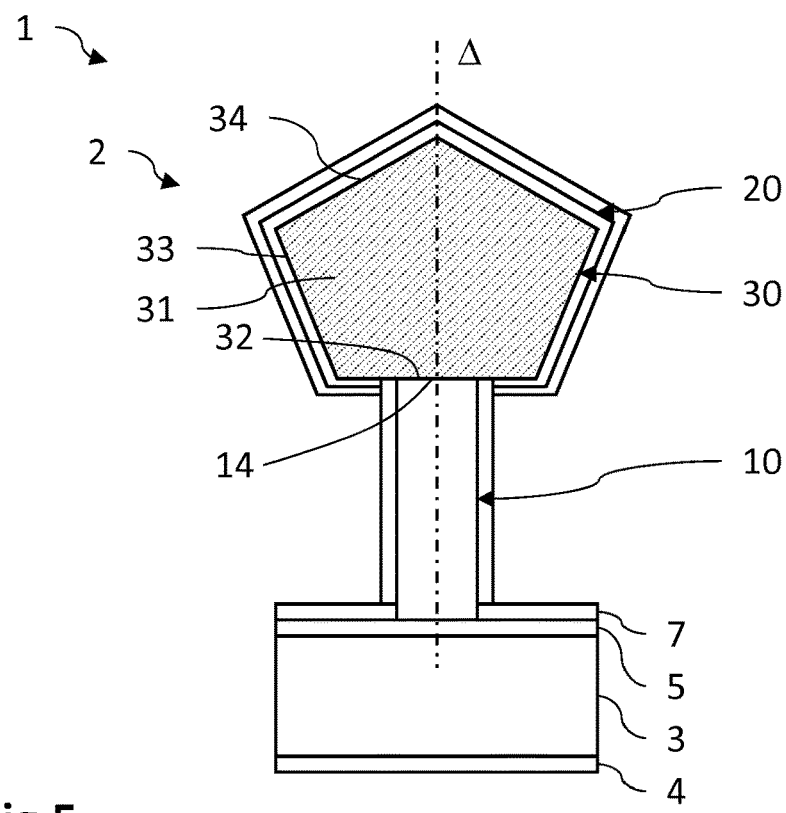
FIG. 5 is a partial, schematic, cross-sectional view of a second embodiment of an optoelectronic device comprising nanowires or microwires in a radial configuration and whose active zone comprises a wider single-crystal portion forming a single quantum well.

FIG. 5 shows schematically a partial sectional view of a second embodiment of an optoelectronic device 1 comprising three-dimensional semiconductor structures 2 forming wire-type light-emitting diodes in a radial configuration and with a single quantum well.

The optoelectronic device 1 differs from that shown in FIG. 2 essentially in that the active zone 30 comprises a single quantum well formed by the wider single-crystal portion 31.

The active zone 30 thus comprises a single quantum well made of the second semiconductor compound, here InGaN, formed from the first semiconductor compound, here GaN, in which at least one additional element is incorporated, in this case indium. The atomic proportion of the elements of the second semiconductor compound $In_xGa_{(1-x)}N$ is preferably substantially uniform within the quantum well, and the second semiconductor compound is preferably unintentionally doped.

The single quantum well of InGaN forms a single crystal 31 that extends from the upper face 14 of the first doped portion 10 and has an average diameter greater than the average diameter of the first doped portion 10. It comprises a base 32 in contact with the upper face 14 of the first doped portion 10, a lateral edge 33 and an upper edge 34. In this example, the lateral edge 33 and the upper edge 34 have semipolar faces, i.e. faces that are inclined with respect to the longitudinal axis Δ.

The wider single-crystal portion 31 is covered at least partly by the second doped portion 20, which in this case covers the lateral edge 33 and the upper edge 34. The second doped portion 20 is in contact with the second polarizing electrode 6.

In this example, the wider single-crystal portion 31 is made of InGaN with an atomic proportion of indium of the order of 18% to obtain an emission wavelength centered on 420 nm to 440 nm, or 25% to obtain an emission wavelength of the order of 500 nm. The average diameter of the wider single-crystal portion 31 is of the order of 5 μm and its average thickness is of the order of 5 μm. Thus, owing to its epitaxial growth starting from a reduced nucleation surface, namely the upper face 14 of the first doped portion 10, the wider single-crystal portion 31 has good crystal quality, with the density of structural defects decreasing with its volume.

Figure 6:
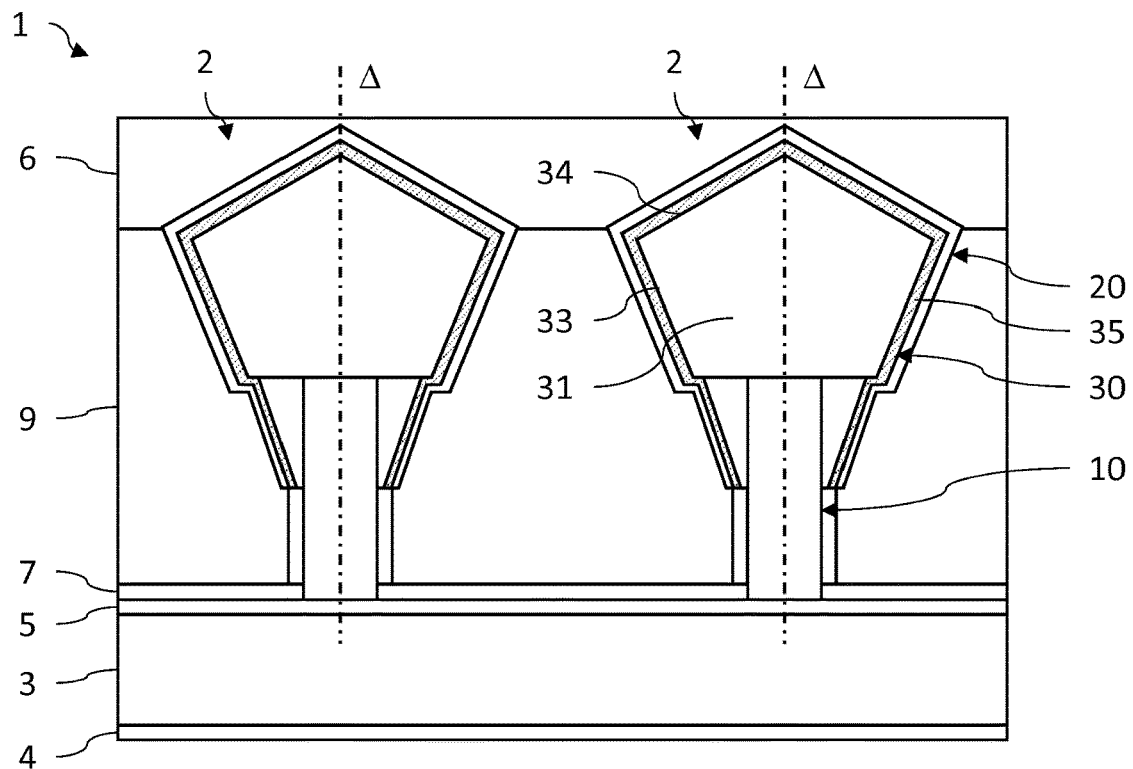
FIGS. 6 and 7 are partial, schematic, cross-sectional views of two variants of the optoelectronic device according to the first embodiment, in which the second polarizing electrode or electrodes are arranged for polarizing different parts of the second doped portion resting on semipolar faces of the wires.
Figure 7:
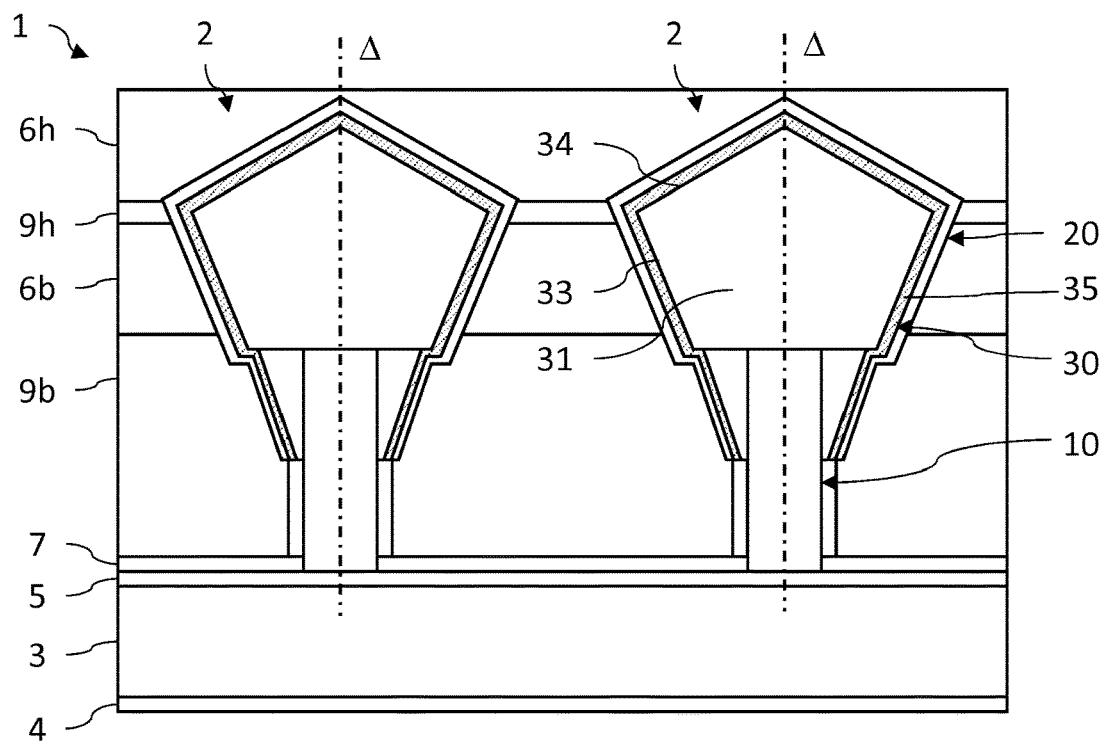

FIGS. 6 and 7 show schematically partial sectional views of two variants of the polarization of an optoelectronic device 1 comprising three-dimensional semiconductor structures 2 similar to that shown in FIG. 4.

In this example, the wires 2 comprise an active zone 30 with a wider single-crystal portion 31 covered at least partly by multiple quantum wells 35, covered in their turn by the second doped portion 20.

The wider single-crystal portion 31 is formed from a single crystal of the second semiconductor compound, in this case InGaN, having semipolar faces formed by the lateral edge 33 and the upper edge 34. As mentioned above, the quantum wells do not have the same optical properties, owing to differences in thickness and/or atomic proportion of indium, depending on whether they are arranged on the semipolar face of the upper edge 34 or on the semipolar face of the lateral edge 33.

In the variant illustrated in FIG. 6, the wires 2 differ from that shown in FIG. 4 essentially in that the second polarizing electrode 6 is no longer in the form of a layer covering the second doped portion 20 continuously, but is in the form of a layer arranged so as to polarize essentially the quantum wells located at the level of the inclined upper edge 34.

More precisely, the optoelectronic device comprises a thick layer 9 of a dielectric material, arranged between the wires 2 over a height such that it covers the first doped portion 10 as well as the part of the second doped portion 20 located at the level of the inclined lateral edge 33. The dielectric material is at least partly transparent with respect to the emission spectrum of the wires and has a refractive index selected so as to allow extraction of the light out of the wires. The dielectric material may be, among others, a silicon oxide or an aluminum or silicon nitride. The second polarizing electrode 6 is deposited on the thick dielectric layer 9 in the form of a layer of a conductive material that is transparent with respect to the emission spectrum of the wires, said conductive layer covering the part of the second doped portion 20 located at the level of the inclined upper edge 34.

Thus, the second doped portion 20 comprises a part located at the level of the inclined upper edge 34 that is in contact with the second polarizing electrode 6, as well as a part located at the level of the inclined lateral edge 33 that is in contact with the thick dielectric layer 9.

In the case of a second doped portion 20 made of p-type doped GaN or of p-type doped InGaN, the electrical resistance of this portion 20 is such that the electric field lines are oriented in a substantially rectilinear manner in the thickness of the second doped portion 20 starting from the electrode 6, and barely extend in the transverse directions, in the thickness of portion 20. Thus, only the part of the second doped portion 20 in contact with the electrode 6 is able to be polarized, the part of the second doped portion located at the level of the inclined lateral edge 33 and not in contact with the electrode 6 barely being polarized at all by the electrode 6.

In the variant illustrated in FIG. 7, the optoelectronic device 1 comprises two second polarizing electrodes, called upper 6h and lower 6b, arranged so as to polarize, for the upper electrode 6h, essentially the part of the second doped portion 20 located at the level of the inclined upper edge 34, and for the lower electrode 6b, essentially the part of the second doped portion 20 located at the level of the inclined lateral edge 33. The electrode 6b rests on a dielectric layer 9b and the electrode 6h rests on a dielectric layer 9h.

The second electrodes, upper 6h and lower 6b, are suitable for applying an electric potential, which may be different or identical, to the two parts of the second doped portion 20, depending on the required properties of the emission spectrum.

Once again, in the case of a second doped portion 20 made of p-type doped GaN or of p-type doped InGaN, the two parts of the second doped portion 20 are polarized by one and/or other of the upper electrode 6h and lower electrode 6b, substantially without interference or crosstalk, owing to the electrical resistance of portion 20.

Of course, these examples are given purely for purposes of illustration. Other arrangements of the second polarizing electrode are possible, for example to only polarize the zone of the second doped portion located at the level of the inclined lateral edge. Moreover, the second polarizing electrode or electrodes may be arranged not in the form of a substantially flat layer, but in the form of structured layers as illustrated in document U.S. Pat. No. 8,937,297.

Particular embodiments have just been described. Different variants and modifications will be evident to a person skilled in the art. Three-dimensional semiconductor structures suitable for emitting light starting from an electrical signal, thus forming light-emitting diodes, have been described. As an alternative, the structures may be adapted for detecting incident light and for producing an electrical signal in response, thus forming a photodiode. The applications may relate to the field of optoelectronics or photovoltaics.

The invention claimed is:

1. An optoelectronic device, comprising at least one three-dimensional semiconductor structure extending along a longitudinal axis substantially orthogonal to a plane of a substrate on which it rests, and comprising:
a first doped portion, extending from the substrate along the longitudinal axis, and made of a first semiconductor compound;
an active zone comprising at least one quantum well, and extending from the first doped portion, said active zone comprising a wider portion, extending from an upper face of one end of the first doped portion opposite the substrate, and having an average diameter greater than that of the first doped portion, and
a second doped portion, at least partly covering the active zone;
wherein:
the wider portion is monocrystalline, and is formed from a single crystal of a second semiconductor compound formed from a mixture of the first semiconductor compound and of at least one additional element;
the active zone is produced on the basis of said second semiconductor compound;
the active zone comprises multiple quantum wells which cover at least part of the wider portion, formed from alternating barrier layers having a first nonzero value of the atomic proportion of said additional element and from layers forming quantum wells having a second value of the atomic proportion of said additional element higher than the first value; and
the first value of the atomic proportion of said additional element of the barrier layers is between 15% and 23% and the second value of the atomic proportion of said additional element of the quantum wells is between 22% and 30%.

2. The optoelectronic device as claimed in claim 1, wherein the single crystal has an atomic proportion of said additional element equal to that of the barrier layer in contact with the single crystal.

3. The optoelectronic device as claimed in claim 1, wherein the wider single-crystal portion forms a single quantum well.

4. The optoelectronic device as claimed in claim 1, in which the wider single-crystal portion has an average thickness along the longitudinal axis greater than 10 nm.

5. The optoelectronic device as claimed in claim 1, in which the wider single-crystal portion has an average diameter greater than 110% of the average diameter of the first doped portion.

6. The optoelectronic device as claimed in claim 1, the first semiconductor compound being selected from III-V compounds, II-VI compounds and group IV elements or compounds.

7. The optoelectronic device as claimed in claim 1, the first semiconductor compound being GaN and the second semiconductor compound being InGaN.

8. The optoelectronic device as claimed in claim 1, in which the second doped portion is at least partly surrounded by a polarizing electrode.

9. The optoelectronic device as claimed in claim 1, wherein the wider portion has at least two semipolar faces with different inclinations relative to the longitudinal axis, said semipolar faces being covered by at least one quantum well covered by the second doped portion.

10. The optoelectronic device as claimed in claim 9, comprising at least two polarizing electrodes each suitable for polarizing a part of the second doped portion located at the level of one or other of said semipolar faces.

11. The optoelectronic device as claimed in claim 6, wherein the first semiconductor compound is a III-N compound.

12. The optoelectronic device as claimed in claim 3, wherein the wider the second semiconductor compound is unintentionally doped.

13. A method for making an optoelectronic device comprising at least one three-dimensional semiconductor structure extending along a longitudinal axis substantially orthogonal to a plane of a substrate on which it rests, and comprising:
a first doped portion, extending from the substrate along the longitudinal axis, and made of a first semiconductor compound;
an active zone comprising at least one quantum well, and extending from the first doped portion, said active zone comprising a wider portion, extending from an upper face of one end of the first doped portion opposite the substrate, and having an average diameter greater than that of the first doped portion, and a second doped portion, at least partly covering the active zone;

wherein:

the wider portion is monocrystalline, and is formed from a single crystal of a second semiconductor compound formed from a mixture of the first semiconductor compound and of at least one additional element; and the active zone is produced on the basis of said second semiconductor compound, the method comprising:

forming the three-dimensional semiconductor structure by chemical vapor deposition, the first semiconductor compound being a III-V compound, and during formation of the first doped portion, a ratio V/III of a flux of the precursor gas of element V to a flux of the precursor gas of element III having a value less than or equal to 100 and, during formation of the wider single-crystal portion, said ratio V/III having a value greater than or equal to 500.

14. The method for making an optoelectronic device as claimed in claim 13, wherein:

the active zone comprises multiple quantum wells which cover at least part of the wider portion, formed from alternating barrier layers having a first nonzero value of the atomic proportion of said additional element and from layers forming quantum wells having a second value of the atomic proportion of said additional element higher than the first value; and the first value of the atomic proportion of said additional element of the barrier layers is between 15% and 23% and the second value of the atomic proportion of said additional element of the quantum wells is between 22% and 30%.

15. A method for making an optoelectronic device comprising at least one three-dimensional semiconductor structure extending along a longitudinal axis substantially orthogonal to a plane of a substrate on which it rests, and comprising:

a first doped portion, extending from the substrate along the longitudinal axis, and made of a first semiconductor compound;

an active zone comprising at least one quantum well, and extending from the first doped portion, said active zone comprising a wider portion, extending from an upper face of one end of the first doped portion opposite the substrate, and having an average diameter greater than that of the first doped portion, and a second doped portion, at least partly covering the active zone;

wherein:

the wider portion is monocrystalline, and is formed from a single crystal of a second semiconductor compound formed from a mixture of the first semiconductor compound and of at least one additional element; and the active zone is produced on the basis of said second semiconductor compound;

the method comprising, during formation of the first doped portion, a ratio $H_2/N_2$ of a proportion of molar flux of hydrogen to a proportion of molar flux of nitrogen having a value greater than or equal to 60/40 and, during formation of the wider single-crystal portion, said ratio $H_2/N_2$ having a value less than or equal to 40/60.

16. The method for making an optoelectronic device as claimed in claim 15, wherein a proportion of molar flux of hydrogen to a proportion of molar flux of nitrogen has a value greater than or equal to 70/30; and said ratio $H_2/N_2$ has a value less than or equal to 30/70.

17. The method for making an optoelectronic device as claimed in claim 15, wherein:

the active zone comprises multiple quantum wells which cover at least part of the wider portion, formed from alternating barrier layers having a first nonzero value of the atomic proportion of said additional element and from layers forming quantum wells having a second value of the atomic proportion of said additional element higher than the first value; and the first value of the atomic proportion of said additional element of the barrier layers is between 15% and 23% and the second value of the atomic proportion of said additional element of the quantum wells is between 22% and 30%.

* * * * *